(12) United States Patent
Kim et al.

(10) Patent No.: US 10,657,348 B2
(45) Date of Patent: May 19, 2020

(54) FINGERPRINT SENSOR AND MANUFACTURING METHOD THEREOF

(71) Applicant: Samsung Display Co., Ltd., Yongin-si, Gyeonggi-do (KR)

(72) Inventors: Jae Kyoung Kim, Yongin-si (KR); Ki Seo Kim, Yongin-si (KR); Won Sang Park, Yongin-si (KR); Jong In Baek, Yongin-si (KR)

(73) Assignee: Samsung Display Co., Ltd. (KR)

( * ) Notice: Subject to any disclaimer, the term of this patent is extended or adjusted under 35 U.S.C. 154(b) by 206 days.

(21) Appl. No.: 15/908,153

(22) Filed: Feb. 28, 2018

(65) Prior Publication Data

US 2018/0276442 A1 Sep. 27, 2018

(30) Foreign Application Priority Data

Mar. 21, 2017 (KR) .................. 10-2017-0035488

(51) Int. Cl.
| | |
|---|---|
| *G06K 9/20* | (2006.01) |
| *G06K 9/00* | (2006.01) |
| *H01L 27/12* | (2006.01) |
| *G06F 3/044* | (2006.01) |
| *G06F 3/041* | (2006.01) |

(52) U.S. Cl.
CPC .......... *G06K 9/0002* (2013.01); *G06F 3/044* (2013.01); *G06K 9/00053* (2013.01); *H01L 27/1255* (2013.01); *H01L 27/1262* (2013.01); *G06F 3/0416* (2013.01); *G06F 2203/04103* (2013.01)

(58) Field of Classification Search
CPC ............ G06K 9/0002; G06K 9/00006–9/0012
See application file for complete search history.

(56) References Cited

U.S. PATENT DOCUMENTS

| | | | |
|---|---|---|---|
| 8,669,843 | B2 | 3/2014 | Chen |
| 8,766,651 | B2 | 7/2014 | Kang et al. |
| 9,460,332 | B1 | 10/2016 | Bussat |
| 9,805,244 | B2 | 10/2017 | Lundahl |
| 2013/0287274 | A1 | 10/2013 | Shi et al. |
| 2014/0266262 | A1 | 9/2014 | Taghibakhsh |
| 2015/0254491 | A1 | 9/2015 | Mo et al. |
| 2016/0098140 | A1 | 4/2016 | Lee et al. |

(Continued)

FOREIGN PATENT DOCUMENTS

| | | |
|---|---|---|
| JP | 2006-014838 A | 1/2006 |
| KR | 10-2018-0001677 A | 1/2018 |
| WO | 2015-146816 A1 | 1/2015 |

OTHER PUBLICATIONS

Minerals.net, "The Precious Gemstone Sapphire", downloaded from https://www.minerals.net/gemstone/sapphire_gemstone.aspx on Apr. 15, 2019, pp. 1-5.

(Continued)

*Primary Examiner* — Brian Werner
(74) *Attorney, Agent, or Firm* — Innovation Counsel LLP

(57) ABSTRACT

A fingerprint sensor according to an exemplary embodiment of the present inventive concept includes a sensor substrate; a plurality of sensor pixels sensing a capacitance change corresponding to a touch of a user, wherein each of the sensor pixels includes a sensor electrode; and a sensor protection layer disposed on the sensor substrate and the plurality of sensor pixels, wherein the sensor protection layer may include a first region having a first permittivity and a second region having a second permittivity less than the first permittivity.

19 Claims, 11 Drawing Sheets

(56) References Cited

U.S. PATENT DOCUMENTS

2016/0260380 A1    9/2016  Yang
2016/0354801 A1   12/2016  Lundahl
2017/0371462 A1   12/2017  Kim et al.
2018/0276442 A1    9/2018  Kim et al.

OTHER PUBLICATIONS

Valley Design Corp., "Optical Transmission of Sapphire Windows and Disks", copyright 2015, 2 pages.
Ferroceramic.com, "Ceramic Properties Tables, Silicon Nitride", copyright 2012, 2 pages.
Jeon Y E et al., "Capacitive sensor array for fingerprint recognition," 2016 10th International Conference on Sensing Technology, Nov. 11, 2016, pp. 1-4.
U.S. Office Action Report, U.S. Appl. No. 15/805,593 dated Jul. 30, 2019, 19 pages.
Technical Bulletin, Innovative Bonding Solutions Etc., Epoxiies, "Water Clear Optically Transparent Epoxy Potting Compound and Adhesive", Jul. 2012, 2 pages, epoxies.com.

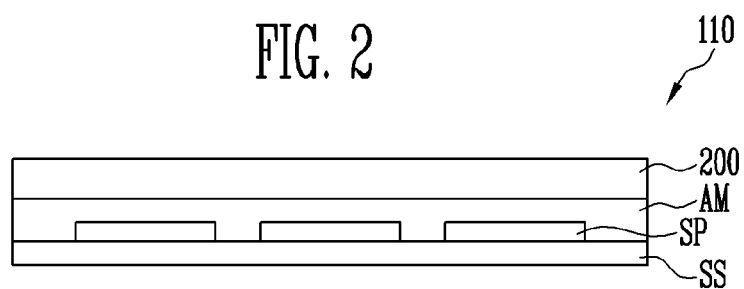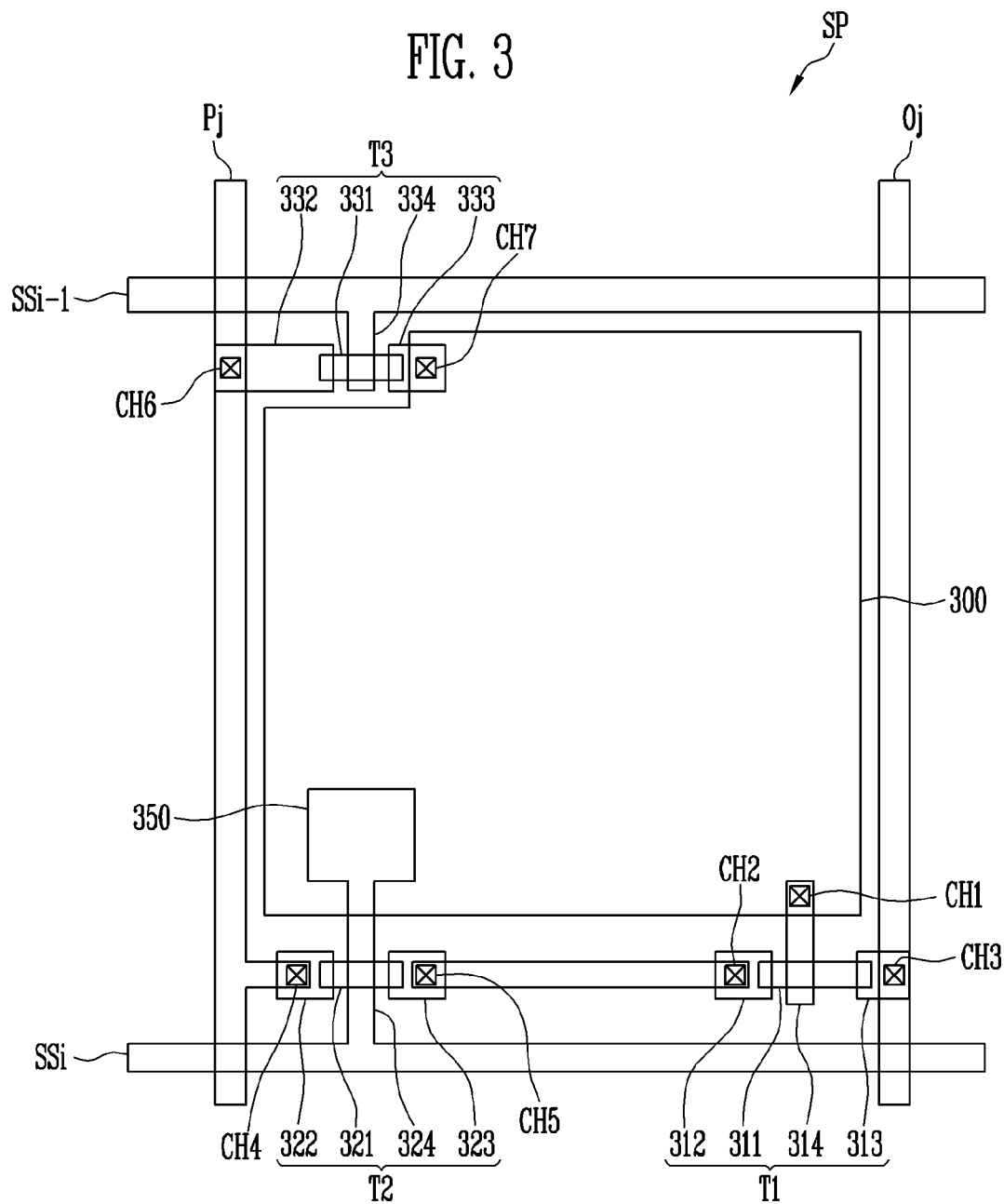

FINGERPRINT SENSOR AND MANUFACTURING METHOD THEREOF

CROSS-REFERENCE TO RELATED APPLICATION

This application claims priority to and the benefit of Korean Patent Application No. 10-2017-0035488 filed in the Korean Intellectual Property Office on Mar. 21, 2017, the entire contents of which are incorporated herein by reference.

BACKGROUND

1. Field

The present inventive concept relates to a fingerprint sensor and a manufacturing method thereof.

2. Description of the Related Art

As technology has been developed recently, a fingerprint sensor capable of detecting a fingerprint with an entire surface of a display device has been developed.

One example of this fingerprint sensor is an active self-capacitive fingerprint sensor. The active self-capacitive fingerprint sensor senses fingerprints based on a capacitive change of a capacitor formed by a user's hand.

Therefore, the active self-capacitive fingerprint sensor requires a thicker sensing distance than existing mutual-capacitive fingerprint sensors.

At this time, the sensing distance means a minimum distance required between a sensor electrode of the fingerprint sensor and the user's hand.

SUMMARY

An exemplary embodiment of the present inventive concept provides a fingerprint sensor satisfying a required sensing distance and having improved sensing sensitivity, and manufacturing method thereof.

A fingerprint sensor according to an exemplary embodiment of the present inventive concept includes a sensor substrate; a plurality of sensor pixels configured to sense a capacitance change corresponding to a touch of a user, wherein each of the sensor pixels includes a sensor electrode; an adhesive member disposed on the sensor substrate and the plurality of sensor pixels; and a sensor protection layer coupled with the sensor substrate and the plurality of sensor pixels by the adhesive member, wherein the sensor protection layer may include a first region having a first permittivity and a second region having a second permittivity less than the first permittivity.

In addition, the first region may be disposed on the sensor electrode, and the second region may be disposed on a peripheral portion of the sensor electrode.

In addition, the fingerprint sensor may further include a plurality of sensor scan lines and a plurality of output lines connected to the plurality of sensor pixels.

A sensor pixel connected to an i-th sensor scan line (i is an integer of 2 or more) and a j-th output line (j is a natural number) among the plurality of sensor pixels may include a first transistor of which a gate electrode is connected to the sensor electrode, the first transistor configured to control a current output through the j-th output line; a second transistor of which a gate electrode is connected to the i-th sensor scan line, the second transistor coupled between a reference voltage line and the first transistor; the capacitor electrode which forms a first capacitor together with the sensor electrode, and which is connected to the i-th sensor scan line.

In addition, the sensor pixel may further include a third transistor of which a gate electrode is connected to the i−1 th scan line, is the third transistor coupled between the reference voltage line and the sensor electrode.

In addition, the sensor electrode may be configured to form a second capacitor together with a finger of the user when a touch occurs.

In addition, the fingerprint sensor is configured to recognize a fingerprint or a palm print of the user may be recognized by using a capacitance change of the second capacitor corresponding to the touch.

In addition, the fingerprint sensor may further include a sensor scan driver configured to sequentially supply a sensor scan signal to the plurality of sensor scan lines.

In addition, the fingerprint sensor may further include a read out circuit configured to detect a fingerprint or a palm print by using a current output through the plurality of output lines.

In addition, the first permittivity may be a relative dielectric constant in a range of 7 or more, and the second permittivity may be a relative dielectric constant in a range of 1 to less than 7. In addition, In addition, a portion of the second region may overlap the sensor electrode.

In addition, the first region may include an inorganic filler by a first ratio, and the second region includes the inorganic filler by a second ratio lower than the first ratio.

In addition, the inorganic filler may include at least one selected from barium titanate (BaTiO3), alumina (Al2O3), and titanium oxide (TiO).

A manufacturing method of a fingerprint sensor according to an exemplary embodiment of the present inventive concept includes forming a plurality of sensor pixels on a sensor substrate, wherein each of the sensor pixels includes a sensor electrode; forming an adhesive member on the sensor substrate and the plurality of sensor pixels; forming a sensor protection layer; and attaching the sensor protection layer on the adhesive member, wherein the sensor protection layer may include a first region having a first permittivity and a second region having a second permittivity less than the first permittivity.

In addition, the first region may be disposed on the sensor electrode, and the second region may be disposed on a peripheral portion of the sensor electrode.

In addition, the first region may include an inorganic filler by a first ratio, and the second region includes the inorganic filler by a second ratio lower than the first ratio.

In addition, the inorganic filler may include at least one selected from barium titanate (BaTiO3), alumina (Al2O3), and titanium oxide (TiO).

In addition, forming a sensor protection layer may include forming a dielectric layer having the second permittivity; forming a plurality of through-holes in the dielectric layer; and filling the plurality of through-holes with a dielectric solution having the first permittivity, and curing.

In addition, a through-hole array may include a plurality of through-holes, and each of the plurality of through-holes is disposed on the sensor electrode.

In addition, each of the plurality of through-holes may have at least one shape selected from a cylinder, an elliptic cylinder, and a rectangular parallelepiped.

In addition, forming the sensor protection layer may include forming a first laminate by stacking sequentially a first layer having the first permittivity and a second layer having the second permittivity; forming a third layer by cutting the first laminate; forming a second laminate by stacking sequentially the second layer and the third layer; and cutting the second laminate.

In addition, the first layer may have a thickness in a range of 130 μm to 150 μm, and the second layer may have a thickness in a range of 20 μm to 30 μm.

A fingerprint sensor according to an exemplary embodiment of the present inventive concept may improve sensing sensitivity while satisfying a required sensing distance condition.

A manufacturing method of the fingerprint sensor according to an exemplary embodiment of the present inventive concept may simplify a process.

BRIEF DESCRIPTION OF THE DRAWINGS

FIG. 2 is a partial cross-sectional view of a fingerprint sensor according to an exemplary embodiment of the present inventive concept.

FIG. 3 is a top plan view of a sensor pixel according to an exemplary embodiment of the present inventive concept.

DETAILED DESCRIPTION OF THE EMBODIMENTS

Figure 1:
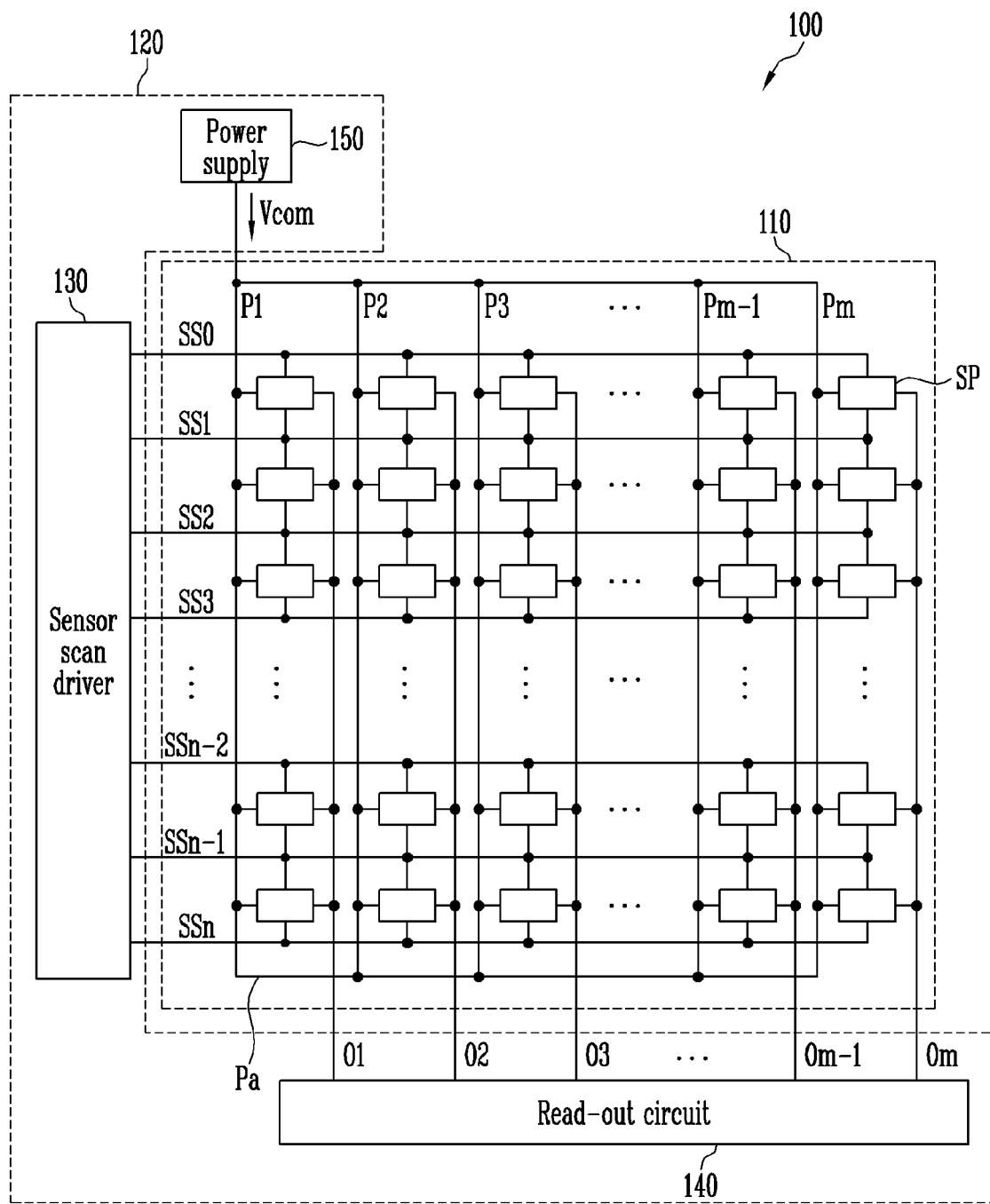
FIG. 1 is a diagram for describing a fingerprint sensor according to an exemplary embodiment of the present inventive concept.

It will be apparent to those skilled in the art that various modifications and variations can be made in the present disclosure without departing from the spirit or scope of the disclosure, and specific exemplary embodiments are exemplified in the drawings and explained in the detailed description. Thus, it is intended that the present inventive concept covers the modifications and variations of this invention provided they come within the scope of the present inventive concept and their equivalents.

The terms used herein are selected by general terms new widely used for the technological field taking into account functions in the present inventive concept, but, those may be varied depending on the technician's intentions engaged in the art, practices or the advent of new technologies. In addition, terms randomly selected by the applicant are used in specific case, and in this case, its meaning will be described in the corresponding description of the invention. Therefore, it is noticed that the terms used in the specification may be interpreted based on the real meanings of the terms and the contents throughout the specification.

The terms, 'first', 'second' and the like may be simply used for description of various constituent elements, but those meanings may not be limited to the restricted meanings. The above terms are used only for distinguishing one constituent element from other constituent elements.

In this disclosure below, when it is described that one "includes" some elements, it should be understood that it may include only those elements, or it may include other elements as well as those elements if there is no specific limitation.

In the drawings, the scale of some components is exaggerated or reduced in order to clearly represent layers and regions. Like reference numerals designate like elements throughout the specification. In addition, it will be understood that when an element such as a layer, film, region, or substrate is referred to as being "on" another element, it can be directly on the other element or intervening elements may also be present. In addition, although one surface of a certain layer is shown as flat in the drawing, it is not necessarily required to be flat, and a step may occur on the surface of the upper layer due to the surface shape of the lower layer in the laminating process Hereinafter, preferred embodiments of the present inventive concept will be described with reference to the accompanying drawings to fully explain the present inventive concept in such a manner that it may easily be carried out by a person with ordinary skill in the art to which the present inventive concept pertains. In order to clarify the present inventive concept, parts not related to the description are omitted from the drawings.

FIG. 1 is a diagram for describing a fingerprint sensor according to an exemplary embodiment of the present inventive concept, and FIG. 2 is a partial cross-sectional view of a fingerprint sensor according to an exemplary embodiment of the present inventive concept.

A fingerprint sensor 100 according to an exemplary embodiment of the present inventive concept may recognize a touch of a user.

Referring to FIGS. 1 and 2, the fingerprint sensor 100 according to an exemplary embodiment of the present inventive concept may include sensor unit 110.

The sensor unit 110 may include a sensor substrate SS, a plurality of sensor pixels SP and a sensor protection layer 200.

The sensor substrate SS may be made of an insulating material such as glass, resin, or the like. In addition, the sensor substrate SS may be made of a material having flexibility so as to be bent or folded, and may have a single-layer structure or a multi-layer structure.

For example, the sensor substrate SS may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, an cellulose acetate propionate.

However, a material constituting the sensor substrate SS may be variously changed, and the sensor substrate SS may be made of glass fiber reinforced plastic (FRP) or the like.

The sensor pixels SP may be disposed on the sensor substrate SS. In addition, the sensor pixels SP may be connected to sensor scan lines SS0-SSn and output lines O1-Om. For example, the sensor pixels SP are arranged in matrix form at a crossing region of a reference voltage lines P1-Pm and the sensor scan lines SS1-SSn.

The sensor pixels SP may receive a sensor scan signal through the sensor scan lines SS0-SSn, and the sensor pixels SP may output a predetermined current corresponding to a touch state to the output lines O1-Om during a supply period of the sensor scan signal.

The sensor scan lines SS0-SSn may be disposed on the sensor substrate SS, and may extend in a first direction (e.g., X-axis direction) to be connected to the sensor pixels SP line by line.

The output lines O1-Om may be disposed on the sensor substrate SS, and may extend in a second direction (e.g., Y-axis direction) to be connected to the sensor pixels SP line by line.

In addition, the sensor pixels SP may be connected to the reference voltage lines P1-Pm, and may be receive a reference voltage Vcom through the reference voltage lines P1-Pm.

The reference voltage lines P1-Pm may be extend in a second direction (e.g., Y-axis direction), and may be connected to the sensor pixels SP line by line.

For example, the reference voltage lines P1-Pm may be arranged in parallel with the output lines O1-Om.

However, arrangement directions of the reference voltage lines P1-Pm may be variously changed, and for example, may be arranged in parallel with the sensor scan lines SS0-SSn.

The reference voltage lines P1-Pm may be electrically connected to each other to maintain the same potential. For example, the reference voltage lines P1-Pm may be electrically connected to each other through a separate line Pa at an outer portion of the sensor substrate SS.

The adhesive member AM may be disposed on the sensor substrate SS and the sensor pixels SP. For example, the adhesive member AM may be an optically clear adhesive member.

The sensor protection layer 200 is for protecting the sensor substrate SS and the sensor pixels SP, and may be attached on the adhesive member AM. That is, the sensor protection layer 200 may be bonded to the sensor substrate SS and the sensor pixels SP by the adhesive member AM. However, the present inventive concept is not limited thereto. According to an exemplary embodiment, the adhesive member AM may be omitted, and the sensor protection layer 200 may be directly bonded to the sensor substrate SS and the sensor pixels SP.

The sensor protection layer 200 may be a surface which receives a touch of a user, and may have a single-layer structure or a multi-layer structure.

For example, the sensor protection layer 200 may be made of an insulating material such as glass, resin, and the like. In addition, the sensor protection layer 200 may be made of a material having flexibility so as to be bent or folded. For example, the sensor protection layer 200 may include a material selected from materials capable of forming the sensor substrate SS described above.

Details of the sensor protection layer 200 will be described in FIGS. 4A and 4B.

Meanwhile, the fingerprint sensor 100 according to an exemplary embodiment of the present inventive concept may further include a sensor driver 120.

The sensor driver 120 may include a sensor scan driver 130, a read-out circuit 140, and a power supply 150 for driving the fingerprint sensor 100.

The sensor scan driver 130 may supply the sensor scan signals to the sensor pixels SP through the sensor scan lines SS0-SSn. For example, sensor scan driver 130 may sequentially output the sensor scan signals to the sensor scan lines SS0-SSn.

The sensor scan signal may have a voltage level capable of turning on a transistor receiving the sensor scan signal.

The sensor scan driver 130 may be formed through the same processes as the sensor pixels SP. Also, according to an exemplary embodiment, the sensor scan driver 130 may be directly mounted on the sensor substrate SS, or may be connected to the sensor substrate SS through a separate element such as a flexible printed circuit board for connection with the sensor scan lines SS0-SSn.

The read-out circuit 140 may receive a signal (e.g., current) output from the sensor pixels SP through the output lines O1-Om.

For example, when the sensor scan driver 130 sequentially supplies the sensor scan signals, the sensor pixels SP are selected line by line, and the read-out circuit 140 may sequentially receive currents output from the sensor pixels SP line by line through the output lines O1-Om.

At this time, the lead-out circuit 140 may recognize touch information by sensing a change amount of the current.

For example, the touch information may include at least one selected from a position of a touch generated in the fingerprint sensor 100 and a valley and a ridge included in a fingerprint or a palm print.

The read-out circuit 140 may be formed through the same processes as the sensor pixels SP. Also, according to an exemplary embodiment, the read-out circuit 140 may be directly mounted on the sensor substrate SS, or may be connected to the sensor substrate SS through a separate element such as a flexible printed circuit board for connection with the output lines O1-Om.

The power supply 150 may supply the reference voltage Vcom to the sensor pixels SP through the reference voltage lines P1-Pm.

The power supply 150 may be formed through the same processes as the sensor pixels SP. Also, according to an exemplary embodiment, the power supply 150 may be directly mounted on the sensor substrate SS, or may be connected to the sensor substrate SS through a separate element such as a flexible printed circuit board for connection with the reference voltage lines P1-Pm.

Although the sensor scan driver 130, the read-out circuit 140, and the power supply 150 are separately shown in FIG. 1, at least some of the elements may be integrated as needed.

In addition, the sensor scan driver 130, the read-out circuit 140 and the power supply 150 may be formed in various ways such as a chip on glass, a chip on plastic, a tape carrier package, a chip on film, and the like.

FIG. 3 is a top plan view of a sensor pixel according to an exemplary embodiment of the present inventive concept. In particular, FIG. 3 shows a pixel connected to the i-th sensor scan line SSi and the j-th output line Oj for convenience of description. Here, i is an integer of 2 or more, and j is a natural number.

Referring to FIG. 3, a sensor pixel SP according to an exemplary embodiment of the present inventive concept may include a sensor electrode 300, a first transistor T1, a second transistor T2, a third transistor T3, and a capacitor electrode 350.

The first transistor T1 may control a current flowing to the j-th output line Oj.

For this purpose, the first transistor T1 may be coupled between the j-th output line Oj and the second transistor T2.

For example, first transistor T1 may include a first electrode 312 connected to a second electrode 323 of the second transistor T2, a second electrode 313 connected to the j-th output line Oj, a gate electrode 314 connected to the sensor electrode 300, and a semiconductor layer 311 coupled between the first electrode 312 and the second electrode 313.

In addition, the gate electrode 314, the first electrode 312 and the second electrode 313 of the first transistor T1 may be connected to other elements through contact holes CH1, CH2 and CH3, respectively.

Therefore, the first transistor T1 may control an output current lo output to the j-th output line Oj corresponding to a potential of the sensor electrode 300.

The second transistor T2 may be coupled between a j-th reference voltage line Pj and the first transistor T1.

For example, the second transistor T2 may includes a first electrode 322 connected to the j-th reference voltage line Pj, a second electrode 323 connected to the first electrode 312 of the first transistor T1, a gate electrode 324 connected to the i-th scan line SSi, and a semiconductor layer 321 coupled between the first electrode 322 and the second electrode 323.

In addition, the first electrode 322 and the second electrode 323 of the second transistor T2 may be connected to other elements through contact holes CH4 and CH5, respectively.

Accordingly, the second transistor T2 may be turned on when the sensor scan signal is supplied to the i-th sensor scan line SSi.

When the second transistor T2 is turned on, the reference voltage Vcom may be supplied to the first electrode 312 of the first transistor T1.

The third transistor T3 may be coupled between the j-th reference voltage line Pj and the sensor electrode 300.

For example, the third transistor T3 may include a first electrode 332 connected to the j-th reference voltage line Pj, a second electrode 333 connected to the sensor electrode 300, a gate electrode 334 connected to an i−1th sensor scan line SSi−1, and a semiconductor layer 331 coupled between the first electrode 332 and the second electrode 333.

In addition, the first electrode 332 and the second electrode 333 of the third transistor T3 may be connected to other elements through contact holes CH6 and CH7, respectively.

Accordingly, the third transistor T3 may be turned on when the sensor scan signal is supplied to the i−1th sensor scan line SSi−1. When the third transistor T3 is turned on, a voltage of the sensor electrode 300 may be initialized to the reference voltage Vcom.

The capacitor electrode 350 may overlap the sensor electrode 300 so that the capacitor electrode 350 may form a capacitor together with the sensor electrode 300.

In addition, the capacitor electrode 350 may be connected to the i-th sensor scan line SSi. For example, the capacitor electrode 350 may be connected to the i-th sensor scan line SSi through the gate electrode 324 of the second transistor T2.

At this time, the capacitor electrode 350 and the gate electrode 324 of the second transistor T2 may be formed of the same material as the i-th sensor scan line SSi.

The sensor electrode 300 may form a capacitor together with the capacitor electrode 350 and a finger of a user.

In addition, the sensor electrode 300 may include a conductive material. For example, the conductive material may include a metal, an alloy thereof, a conductive polymer, a transparent conductive material, or the like.

Examples of the metal may include copper, silver, gold, platinum, palladium, nickel, tin, aluminum, cobalt, rhodium, iridium, iron, ruthenium, osmium, manganese, molybdenum, tungsten, niobium, tantalum, titanium, bismuth, antimony, lead, and the like.

In addition, examples of the conductive polymer may include polythiophene-based compound, polypyrrole-based compound, polyaniline-based compound, polyacetylene-based compound, polyphenylene-based compound, and a mixture thereof, or the like, particularly PEDOT/PSS compound of polythiophene-based compound.

Examples of the transparent conductive material may include sliver nanowire (AgNW), indium tin oxide (ITO), IZO (indium zinc oxide), AZO (antimony zinc oxide), ITZO (indium tin zinc oxide), ZnO (zinc oxide), SnO2 (tin Oxide), carbon nanotube (carbon nano tube), graphene, or the like.

Figure 4A:
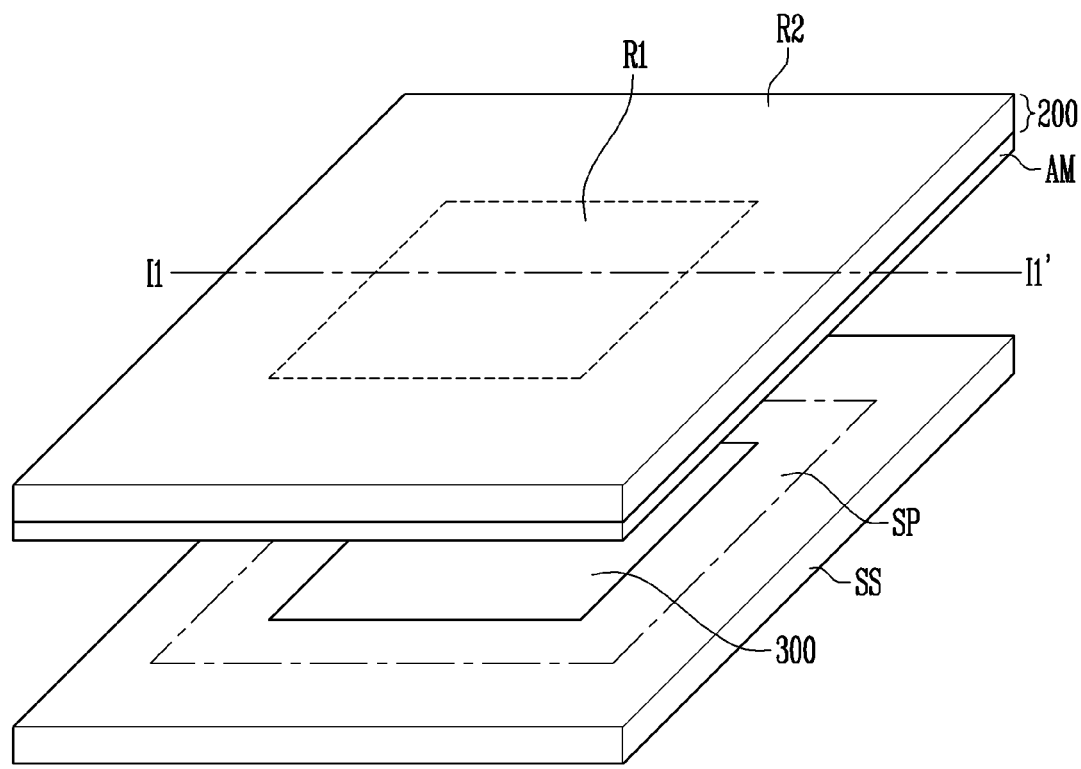
FIGS. 4A and 4B are diagrams for describing in detail a sensor protection layer according to an exemplary embodiment of the present inventive concept.
Figure 4B:
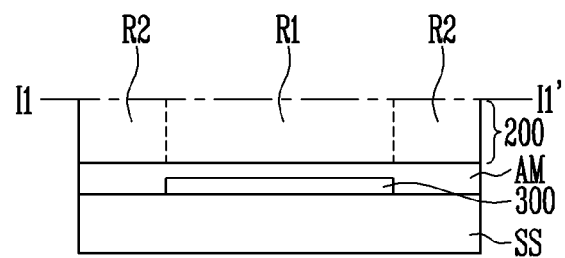

FIGS. 4A and 4B are diagrams for describing in detail a sensor protection layer according to an exemplary embodiment of the present inventive concept. Specifically, FIG. 4A shows a sensor pixel SP, an adhesive member AM formed on an upper side of the sensor substrate SS, and a sensor protection layer 200. FIG. 4B is a cross-sectional view taken along line I1-I1' of a sensor protection layer 200 shown in FIG. 4A.

In FIG. 4A, the sensor substrate SS and the sensor protection layer 200 are shown as being spaced apart from each other for convenience of description.

In addition, in FIG. 4B, only the sensor electrode 300 among the elements of the sensor pixel SP shown in FIG. 3 is shown for convenience of description, but the present inventive concept is not limited thereto.

Referring to FIGS. 2 to 4A and FIG. 4B, the sensor protection layer 200 may include a first region R1 and a second region R2 extending in a boundary direction of the first region R1.

The first region R1 may be a region disposed on the sensor electrode 300 and the second region R2 may be a region disposed on a peripheral portion of the sensor electrode 300, e.g., on an area surrounding the sensor electrode 300 rather than overlapping with the sensor electrode 300.

However, the present inventive concept is not limited thereto, and a portion of the second region R2 may overlap the sensor electrode 300 according to an exemplary embodiment, e.g., overlap the sensor electrode 300 at the outer edges of the sensor electrode 300. In addition, according to an exemplary embodiment, a portion of the first region R1 may overlap the peripheral portion of the sensor electrode 300, e.g. overlap an area immediately surrounding the sensor electrode 300.

The sensor protection layer 200 may have a characteristic of a high hardness. For example, a hardness of the sensor protection layer 200 may be 8H or more and 10H or less. The hardness described above means a hardness according to a Mohs hardness meter.

In addition, the sensor protection layer 200 may have a characteristic of a high transmittance. For example, the transmittance of the sensor protection layer 200 may be 90% or more and 100% or less.

The permittivity is briefly described below.

$$C=E*A/d, \qquad \text{[Equation 1]}$$

C is a capacitance, E is a permittivity, A is an area of an electrode plate, and d is a distance between the electrode plates.

$$Er=E/E0, \qquad \text{[Equation 2]}$$

Er is a relative dielectric constant, E is a permittivity, and E0 is a permittivity of a vacuum and is 8.854185×10-12 F/m at room temperature and a frequency of 1 kHz.

Specifically, the permittivity changes based on a temperature or a frequency, but a detailed description thereof will be omitted.

For example, polycrystalline silicon nitride may have a relative dielectric constant in a range of 7 to 8 at room temperature and a frequency of 1 MHz.

For example, barium titanate (BaTiO3) may have a relative dielectric constant of 1200 or more at room temperature and a frequency of 1 kHz.

The first region R1 may have a first permittivity. The first permittivity may be a high permittivity relative to a second permittivity. For example, the first permittivity may be a relative dielectric constant in a range of 7 or more at room temperature and a frequency of 1 MHz.

The second region R2 may have a second permittivity different from the first permittivity. The second permittivity may be a lower permittivity relative to the first permittivity. For example, the second permittivity may be a relative dielectric constant in a range of 1 or more to less than 7 at room temperature and a frequency of 1 MHz.

The first region R1 may include an inorganic filler by a first ratio. The first ratio may mean a volume ratio or a mass ratio of the inorganic filler to resin forming the first region R1 of the sensor protection layer 200. The first ratio may be set to an appropriate value so that the first region R1 may have the first permittivity.

The second region R2 may include an inorganic filler by a second ratio lower than the first ratio. The second ratio may mean a volume ratio or a mass ratio of the inorganic filler to resin forming the second region R2 of the sensor protection layer 200. The second ratio may be set to an appropriate value so that the second region R2 may have the second permittivity.

For example, the inorganic filler may include at least one selected from barium titanate (BaTiO3), alumina (Al2O3), and titanium oxide (TiO).

Figure 5A:
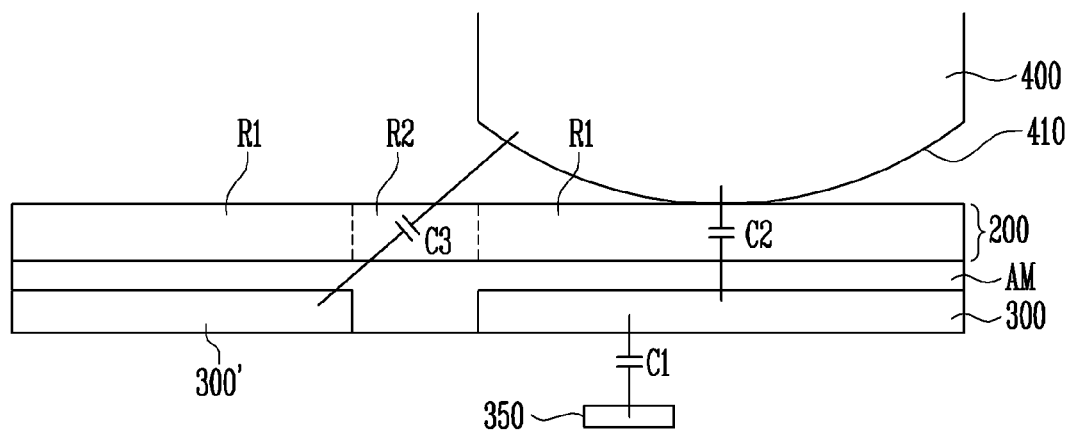
FIGS. 5A and 5B are diagrams for explaining how a capacitance of a second capacitor related to a sensor electrode changes according to a ridge and a valley of the fingerprint.
Figure 5B:
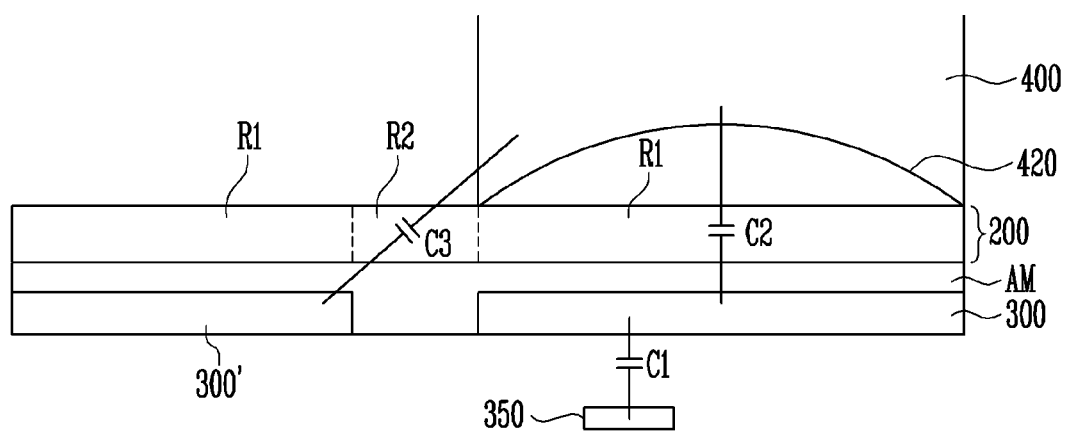

FIGS. 5A and 5B are cross-sectional views of a sensor pixel according to an exemplary embodiment of the present inventive concept. FIGS. 5A and 5B are diagrams for explaining how a capacitance of a second capacitor related to a sensor electrode changes according to a ridge and a valley of the fingerprint.

In particular, FIG. 5A shows a case where a ridge 410 of a finger 400 is disposed on the sensor pixel SP and FIG. 5B shows a case where a valley 420 of the finger 400 is disposed on the sensor pixel SP.

Referring to FIG. 4A to 5B, the first region R1 of the sensor protection layer 200 may be disposed on the sensor electrode 300, and the sensor protection layer 200 may be used as a surface for inputting a touch of a user.

In addition, for convenience of description, an adjacent sensor electrode 300' is also shown in FIGS. 5A and 5B The sensor electrode 300 and the capacitor electrode 350 may form a first capacitor C1. The sensor electrode 300 and the capacitor electrode 350 may be spaced apart from each other, and at least one insulating layer (not shown) may be disposed therebetween.

In addition, when the finger 400 of the user is disposed on the sensor pixel SP for fingerprint recognition, the sensor electrode 300 and the finger 400 may form a second capacitor C2.

At this time, the second capacitor C2 may be a variable capacitor, and the capacitance of the second capacitor C2 may be changed depending on which of the ridge 410 or the valley 420 of the fingerprint is disposed on the sensor electrode 300.

That is, a distance between the ridge 410 and the sensor electrode 300 is shorter than the distance between the ridge 420 and the sensor electrode 300. Therefore, the capacitance of the second capacitor C2 when the ridge 410 is disposed on the sensor electrode 300 as shown in FIG. 5A is different from the capacitance of the second capacitor C2 when the valley 420 is disposed on the sensor electrode 300 as shown in FIG. 5B.

Referring to FIGS. 1 to 5A and FIG. 5B, since the change in the capacitance of the second capacitor C2 affects an output current lo of the sensor pixel SP, the lead-out circuit 140 may recognize the fingerprint or the palm print of a user by sensing a change amount of the output current lo.

Meanwhile, the adjacent sensor electrode 300' and the finger 400 may form a third capacitor C3. At this time, the third capacitor C3 may be a variable capacitor, and may be a capacitor unintentionally generated.

As shown in FIGS. 5A and 5B, the adjacent sensor electrode 300' may not be able to sense the ridge 410 or the valley 420 of the finger 400 due to the third capacitor C3. This may lead to a poor sensing by the fingerprint sensor 100.

In order to prevent this phenomenon, the fingerprint sensor 100 according to an exemplary embodiment of the present inventive concept may dispose the first region R1 having a high permittivity on the sensor electrode 300, and may dispose the second region R2 having a low permittivity on a space between the sensor electrode 300 and the adjacent sensor electrode 300'.

As shown in FIGS. 5A and 5B, when the first region R1 having a high permittivity is disposed between the ridge 410 and the sensor electrode 300 or between the valley 420 and the sensor electrode 300, a capacitance of the second capacitor C2 calculated by Equation 1 may increase.

Likewise, when the second region R2 having a low permittivity is disposed between the ridge 410 and the adjacent sensor electrode 300' or between the valley 420 and the adjacent sensor electrode 300', a capacitance of the third capacitor C3 calculated by Equation 1 may decrease.

Therefore, the ratio of the capacitance of the second capacitor C2 to the capacitance of the third capacitor C3 may relatively increase.

As a result, the fingerprint sensor 100 according to an exemplary embodiment of the present inventive concept may have an improved sensing sensitivity.

Figure 6:
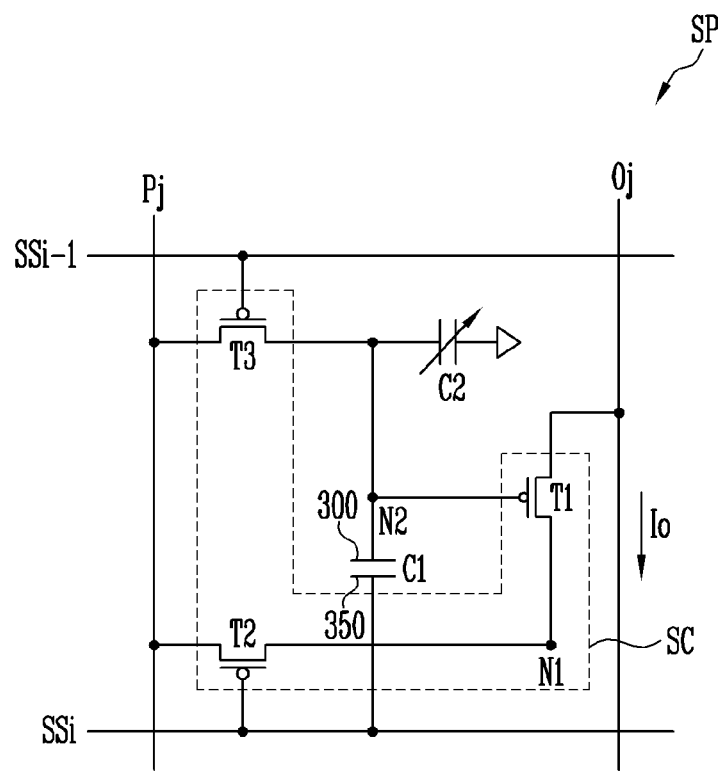
FIG. 6 is a diagram for describing an exemplary embodiment of an equivalent circuit of a sensor pixel shown in FIG. 3.
Figure 7:
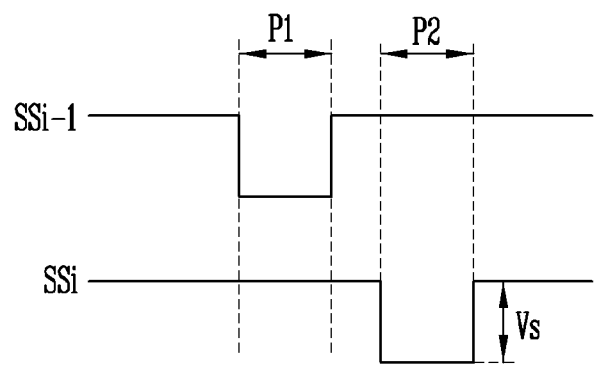
FIG. 7 is a waveform diagram for explaining an operation of a sensor pixel shown in FIG. 6.

FIG. 6 is a diagram for describing an exemplary embodiment of an equivalent circuit of a sensor pixel shown in FIG. 3, and FIG. 7 is a waveform diagram for explaining an operation of a sensor pixel shown in FIG. 6.

In particular, FIG. 6 shows a sensor pixel SP connected to the i-th sensor scan line SSi, the i−1th sensor scan line SSi−1 and the j-th output line Oj for convenience of description. In addition, FIG. 7 shows the sensor scan signal supplied to the i-1th sensor scan line SSi-1 and the sensor scan signal supplied to the i-th sensor scan line SSi.

Referring to FIG. 6, the sensor pixel SP may include a sensor electrode 300, a capacitor electrode 350, a first transistor T1, a second transistor T2, and a third transistor T3.

As described above, the sensor electrode 300 and the capacitor electrode 350 may constitute a first capacitor C1, and the first transistor T1, the second transistor T2 and the third transistor T3 may constitute a sensor circuit SC.

In addition, the second capacitor C2 may be a variable capacitor, and may include the sensor electrode 300 and the finger 400 as described above. At this time, the capacitance of the second capacitor C2 may be changed depending on a distance between the sensor electrode 300 and the finger 400, which of the valley or ridge of the fingerprint is disposed on the sensor electrode 300, and an intensity of a pressure due to the touch, and the like.

The first transistor T1 may control a current flowing to the j-th output line Oj. For this purpose, the first transistor T1 may be coupled between the j-th output line Oj and the second transistor T2.

In other words, the first transistor T1 may be coupled between the j-th output line Oj and a first node N1, and a gate electrode thereof may be connected to a second node N2.

For example, the first transistor T1 may include a first electrode 312 connected to a second electrode 323 of the second transistor T2, a second electrode 313 connected to the j-th output line Oj, and a gate electrode 314 connected to the sensor electrode 300.

The second transistor T2 may be coupled between a j-th reference voltage line Pj and the first transistor T1.

In other words, the second transistor T2 may be coupled between the j-th reference voltage line Pj and the first node N1, and a gate electrode thereof may be connected to the i-th sensor scan line SSi.

For example, the second transistor T2 may includes a first electrode 322 connected to the j-th reference voltage line Pj, a second electrode 323 connected to the first electrode 312 of the first transistor T1, and a gate electrode 324 connected to the i-th scan line SSi.

Accordingly, the second transistor T2 may be turned on when the sensor scan signal is supplied to the i-th sensor scan line SSi. When the second transistor T2 is turned on, the reference voltage Vcom may be supplied to the first electrode 312 of the first transistor T1.

The third transistor T3 may be coupled between the j-th reference voltage line Pj and the sensor electrode 300.

In other words, the third transistor T3 may be coupled between the second node N2 and the j-th reference voltage line Pj, and a gate electrode thereof may be connected to the i-1 sensor scan line SSi-1.

For example, the third transistor T3 may include a first electrode 332 connected to the j-th reference voltage line Pj, a second electrode 333 connected to the sensor electrode 300, and a gate electrode 334 connected to an i-1th sensor scan line SSi-1.

Accordingly, the third transistor T3 may be turned on when the sensor scan signal is supplied to the i-1th sensor scan line SSi-1. When the third transistor T3 is turned on, a voltage of the sensor electrode 300 may be initialized to the reference voltage Vcom.

The capacitor electrode 350 may overlap the sensor electrode 300 so that the capacitor electrode 350 may form a first capacitor together with the sensor electrode 300.

In addition, the capacitor electrode 350 may be connected to the i-th sensor scan line SSi.

Accordingly, the first capacitor C1 may be coupled between the second node N2 and the i-th sensor scan line SSi.

In addition, the second capacitor C2 may be connected to the second node N2.

The first node N1 is a node to which the first electrode of the first transistor T1 and the second electrode of the second transistor T2 are commonly connected, and the second node N2 is a node to which the sensor electrode 300, the gate electrode of the first transistor T1 and the second electrode of the third transistor T3 are commonly connected.

Here, the first electrode of the transistors T1, T2 and T3 may be set to one of a source electrode and a drain electrode, and the second electrode of the transistors T1, T2 and T3 may be set to different electrode from the first electrode. For example, if the first electrode is set to the source electrode, the second electrode may be set to the drain electrode.

In addition, although the transistors T1, T2, and T3 are illustrated as being PMOS transistors in FIG. 6, in another exemplary embodiment, the transistors T1, T2, and T3 may be implemented as NMOS transistors.

FIG. 7 is a waveform diagram for explain an operation of a sensor pixel shown in FIG. 6. Referring to FIG. 7, the sensor scan signal may be supplied to the i-1 sensor scan line SSi-1 during a first period P1.

Therefore, in the first period P1, the third transistor T3 may maintain an on state, and the second node N2 may be initialized to the reference voltage Vcom supplied from the j-th reference voltage line Pj.

Thereafter, the sensor scan signal may be supplied to the i-th sensor scan line SSi during a second period P2.

Therefore, in the second period P2, the second transistor T2 may maintain an on state, and the output current lo may flow from the j-th reference voltage line Pj through the second transistor T2 and the first transistor T1 to the j-th output line Oj.

At this time, the first transistor T1 may control an amount of the output current lo corresponding to the gate voltage (i.e., a voltage of the second node N2).

For example, the output current lo may be changed according to a gate voltage Vg of the first transistor T1, and the gate voltage Vg of the first transistor T1 may be determined according to the following equation.

$$Vg=Vcom+\{Vc1/(Vc1+Vc2)\}*Vs$$

Here, Vcom is a reference voltage, Vc1 is a capacitance of the first capacitor C1, Vc2 is a capacitance of the second capacitor C2, and Vs is a voltage change amount of the sensor scan signal supplied to the i-th sensor scan line SSi.

Figure 8A:
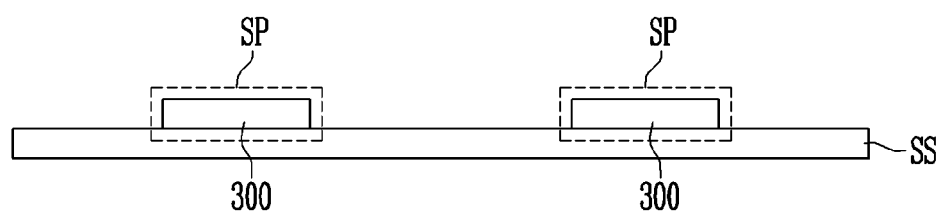
FIGS. 8A, 8B and 8C are diagrams for describing a manufacturing method of a fingerprint sensor according to an exemplary embodiment of the present inventive concept.
Figure 8B:
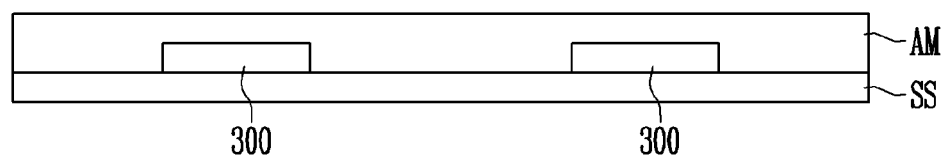
Figure 8C:
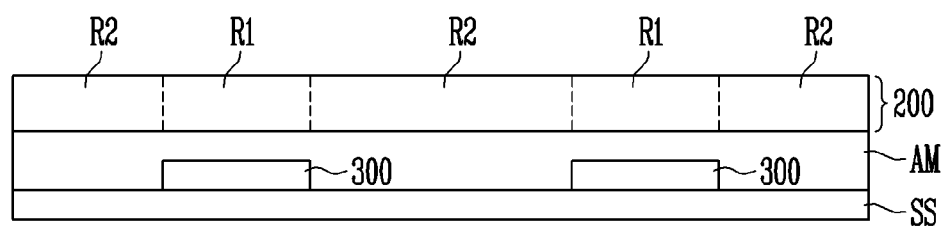

FIGS. 8A to 8C are diagrams for describing a manufacturing method of a fingerprint sensor according to an exemplary embodiment of the present inventive concept.

In FIGS. 8A to 8C, only the sensor electrode 300 among the elements of the sensor pixel SP shown in FIG. 3 is shown for convenience of description, but the present inventive concept is not limited thereto.

Referring to FIG. 8A, a plurality of sensor pixels SP may be formed on a sensor substrate SS. Each of the plurality of sensor pixels SP may include a sensor electrode 300.

Referring to FIG. 8B, an adhesive member AM may be formed on the sensor substrate SS and the plurality of sensor pixels SP.

Referring to FIG. 8C, the sensor protection layer 200 may be formed and attached to the adhesive member AM. That is, the sensor protection layer 200 may be bonded to the sensor substrate SS and the plurality of sensor pixels SP by an adhesive member AM.

As described in FIGS. 4A and 4B, the sensor protection layer 200 may include a first region R1 and a second region R2.

The first region R1 may be a region disposed on the sensor electrode 300 and the second region R2 may be a region disposed on a peripheral portion of the sensor electrode 300.

The first region R1 may have a first permittivity. The first permittivity may be a high permittivity relative to a second permittivity. For example, the first permittivity may be a relative dielectric constant in a range of 7 or more at room temperature and a frequency of 1 MHz.

The second region R2 may have a second permittivity different from the first permittivity. The second permittivity may be a lower permittivity relative to the first permittivity. For example, the second permittivity may be a relative dielectric constant in a range of 1 or more to less than 7 at room temperature and a frequency of 1 MHz.

Figure 9A:
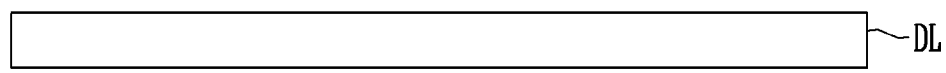
FIGS. 9A, 9B and 9C are diagrams for describing in detail the step of forming sensor protection layer in a manufacturing method of a fingerprint sensor according to an exemplary embodiment of the present inventive concept.
Figure 9B:
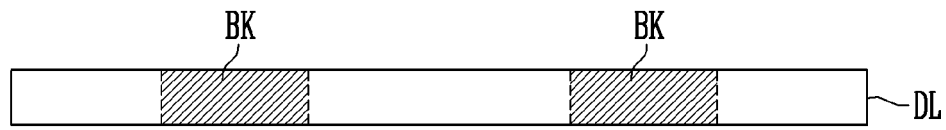
Figure 9C:
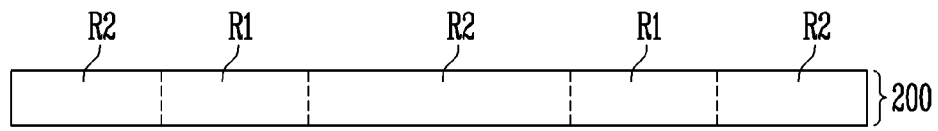

FIGS. 9A to 9C are diagrams for describing in detail a step of forming a sensor protection layer in a manufacturing method of a fingerprint sensor according to an exemplary embodiment of the present inventive concept.

Referring to FIG. 9A, a dielectric layer DL having a second permittivity may be formed.

Referring to FIG. 9B, a plurality of through-holes BK may be formed on the dielectric layer DL. The plurality of through-holes BK may be formed in at least one region of the dielectric layer DL, and may be spaced apart from each other at the same interval. However, the present inventive concept is not limited thereto, and the plurality of through-holes BK may be spaced apart from each other at a different interval.

The plurality of through-holes BK may be formed in the dielectric layer DL such that the plurality of through holes BK are disposed on the sensor electrode 300 included in the sensor pixel SP.

For example, each of the plurality of through-holes BK may be a hollow hole formed by etching the dielectric layer DL. The plurality of through-holes BK may be arranged in an array structure.

According to an exemplary embodiment, each of the plurality of through-holes BK may have at least one shape of a cylinder, an ellipse cylinder, or a rectangular parallelepiped depending on a shape of the hollow hole.

According to an exemplary embodiment, each of the plurality of through-holes BK may have the same shape.

According to another exemplary embodiment, each of the plurality of through-holes BK may have different shapes from each other. For example, a number of the plurality of through-holes BK may have a cylindrical shape, and others of the plurality of through-holes may have an elliptic cylindrical shape, but the present inventive concept is not limited thereto.

Referring to FIG. 9C, the sensor protection layer 200 may be formed by filling the plurality of through-holes BK with a dielectric solution having the first permittivity and curing the dielectric solution.

For example, the dielectric solution may be cured by photo curing method or heat curing method.

As described in FIGS. 4A and 4B, the sensor protection layer 200 may include the first region R1 and the second region R2.

The first region R1 may be a region disposed on the sensor electrode 300 and the second region R2 may be a region disposed on a peripheral portion of the sensor electrode 300.

The first region R1 may have a first permittivity. The first permittivity may be a high permittivity relative to a second permittivity.

The second region R2 may have a second permittivity different from the first permittivity. The second permittivity may be a lower permittivity relative to the first permittivity.

The dielectric solution and the first region R1 may include an inorganic filler by a first ratio. The first ratio may mean a volume ratio or a mass ratio of the inorganic filler to resin forming the first region R1 of the sensor protection layer 200. The first ratio may be set to an appropriate value so that the first region R1 may have the first permittivity.

The dielectric layer DL and the second region R2 may include an inorganic filler by a second ratio lower than the first ratio. The second ratio may mean a volume ratio or a mass ratio of the inorganic filler to resin forming the second region R2 of the sensor protection layer 200. The second ratio may be set to an appropriate value so that the second region R2 may have the second permittivity.

For example, the inorganic filler may include at least one selected from barium titanate ($BaTiO_3$), alumina ($Al_2O_3$), and titanium oxide ($TiO$).

FIGS. 10A to 10D are diagrams for describing in detail the step of forming sensor protection layer in a manufacturing method of a fingerprint sensor according to another exemplary embodiment of the present inventive concept.

Figure 10A:
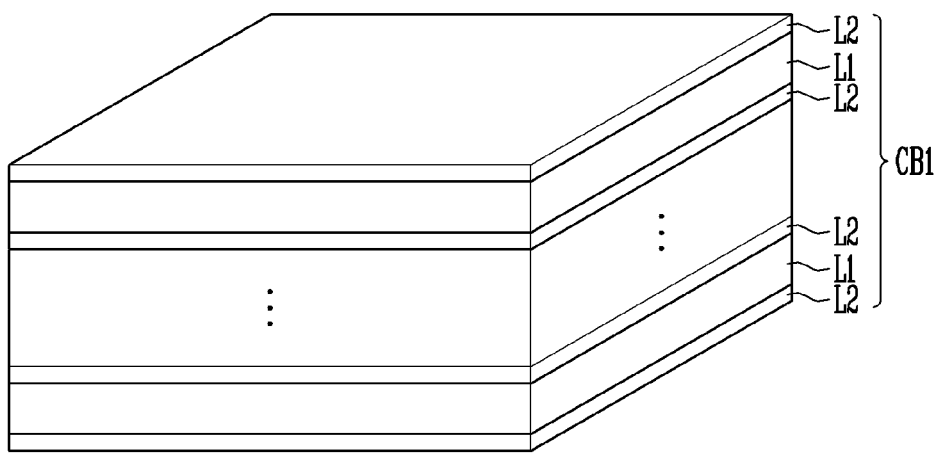
FIGS. 10A, 10B, 10C and 10D are diagrams for describing in detail the step of forming sensor protection layer in a manufacturing method of a fingerprint sensor according to another exemplary embodiment of the present inventive concept.

Referring to FIG. 10A, the first layer L1 having the first permittivity and the second layer L2 having the second permittivity may be sequentially stacked. As a result of stacking, a first laminate CB1 may be formed.

Figure 10B:
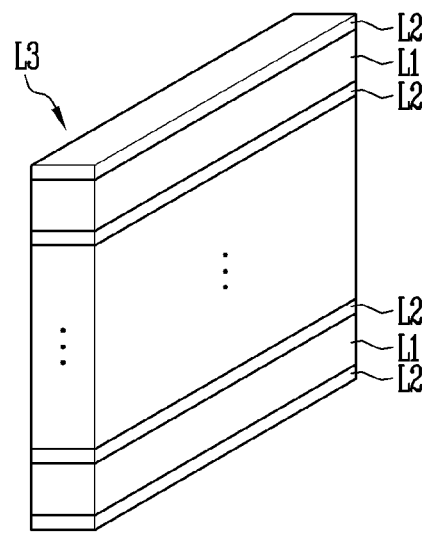

Referring to FIG. 10B, the first laminate CB1 is cut so that a third layer L3 may be formed. Specifically, the first laminate CB1 is cut along a stacking direction, so that the third layer L3 may be formed.

Figure 10C:
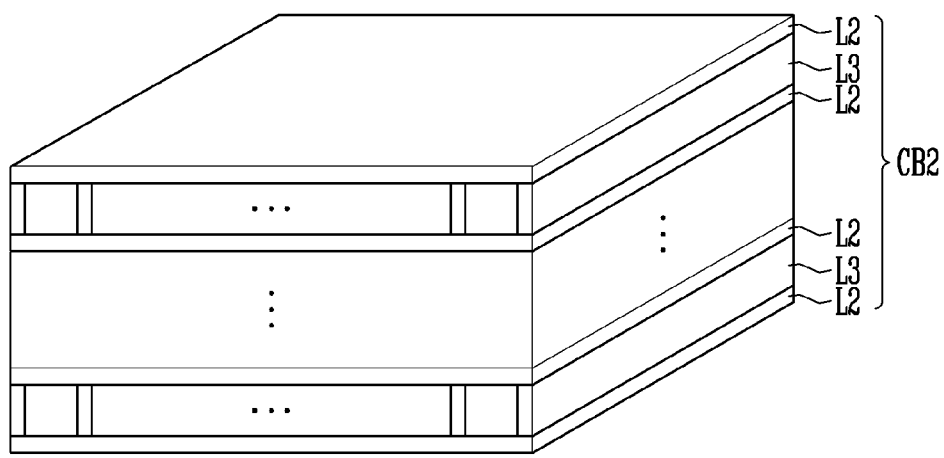

Referring to FIG. 10C, the second layer L2 and the third layer L3 may be sequentially stacked. As a result of stacking, a second laminate CB2 may be formed.

Figure 10D:
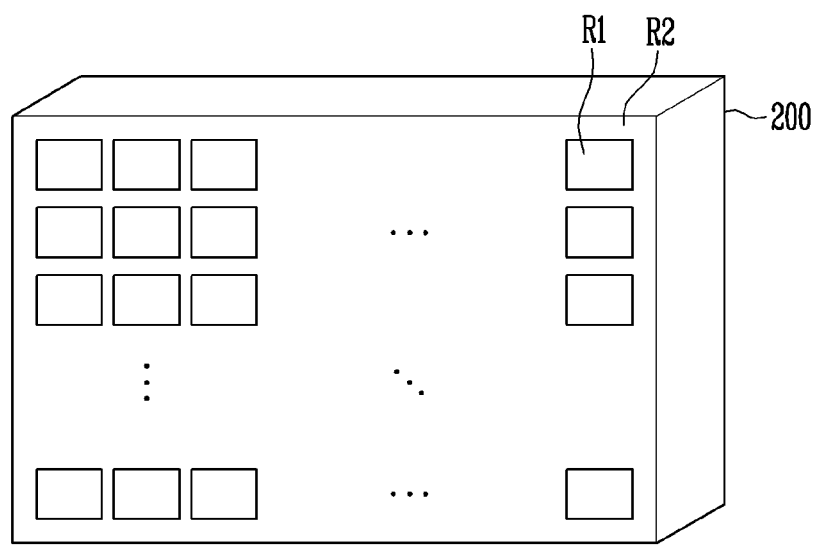

Referring to FIG. 10D, the second laminate CB2 is cut so that a sensor protection layer 200 may be formed. Specifically, the second laminate CB2 is cut along a stacking direction, so that the sensor protection layer 200 may be formed. For example, the first and second layers L1 and L2 in the third layer L3 may extend in one direction, and the CB2 may be cut in direction perpendicular to the extending direction so that the sensor protection layer 200 may be formed; however, the present inventive concept is not limited thereto.

As described in FIGS. 4A and 4B, the sensor protection layer 200 may include the first region R1 and the second region R2.

The first region R1 may be a region disposed on the sensor electrode 300 and the second region R2 may be a region disposed on a peripheral portion of the sensor electrode 300.

The first region R1 may have a first permittivity. The first permittivity may be a high permittivity relative to a second permittivity.

The second region R2 may have a second permittivity different from the first permittivity. The second permittivity may be a lower permittivity relative to the first permittivity.

The first layer L1 and first region R1 may include an inorganic filler by a first ratio. The first ratio may mean a volume ratio or a mass ratio of the inorganic filler to resin forming the first region R1 of the sensor protection layer 200. The first ratio may be set to an appropriate value so that the first region R1 may have the first permittivity.

The second layer L2 and second region R2 may include an inorganic filler by a second ratio lower than the first ratio.

The second ratio may mean a volume ratio or a mass ratio of the inorganic filler to resin forming the second region R2 of the sensor protection layer 200. The second ratio may be set to an appropriate value so that the second region R2 may have the second permittivity.

For example, the inorganic filler may include at least one selected from barium titanate (BaTiO3), alumina (Al2O3), and titanium oxide (TiO).

As shown in FIGS. 2 to 4A and FIG. 4B, an area of the first region R1 shown in FIG. 10D is substantially the same as a area of the sensor electrode 300 so that the sensor electrode 300 and the first region R1 of the sensor protection layer 200 may be aligned. For example, the area of the first region R1 may be the same as the area of the sensor electrode 300 within a 10% error range.

For example, in order to achieve a size condition described above, the first layer L1 may have a thickness in a range of 130 μm to 150 μm, and the second layer L2 may have a thickness in a range of 20 μm to 30 μm. However, the present inventive concept is not limited thereto.

Figure 11:
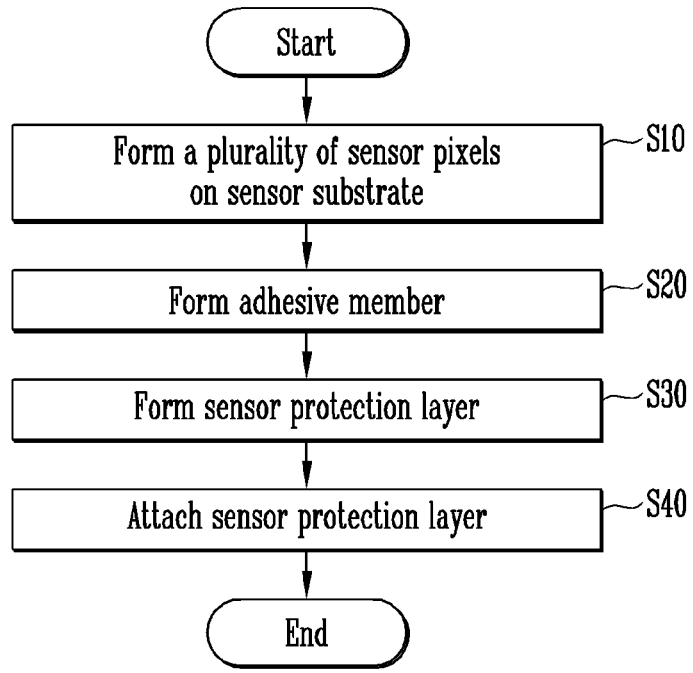
FIG. 11 is a flowchart describing a manufacturing method of a fingerprint sensor shown in FIGS. 8A, 8B and 8C.

FIG. 11 is a flowchart describing a manufacturing method of a fingerprint sensor shown in FIG. 8A to 8C.

Referring to FIGS. 2 to 10D, a plurality of sensor pixels SP may be formed on the sensor substrate SS (S10).

Each of the plurality of sensor pixels SP may include a sensor electrode 300.

An adhesive member AM may be formed on the sensor substrate SS and the plurality of sensor pixels SP (S20).

A sensor protection layer 200 may be formed (S30). The sensor protection layer 200 may be attached, for example to the adhesive member AM (S40).

As described in FIGS. 4A and 4B, the sensor protection layer 200 may include a first region R1 and a second region R2.

The first region R1 may be a region disposed on the sensor electrode 300 and the second region R2 may be a region disposed on a peripheral portion of the sensor electrode 300.

The first region R1 may have a first permittivity. The first permittivity may be a high permittivity relative to a second permittivity. For example, the first permittivity may be a relative dielectric constant in a range of 7 or more at room temperature and a frequency of 1 MHz.

The second region R2 may have a second permittivity different from the first permittivity. The second permittivity may be a lower permittivity relative to the first permittivity. For example, the second permittivity may be a relative dielectric constant in a range of 1 or more to less than 7 at room temperature and a frequency of 1 MHz.

The sensor protection layer 200 may be attached on the adhesive member AM (S40). That is, the sensor protection layer 200 may be bonded to the sensor substrate SS and the sensor pixels SP by the adhesive member AM.

Figure 12:
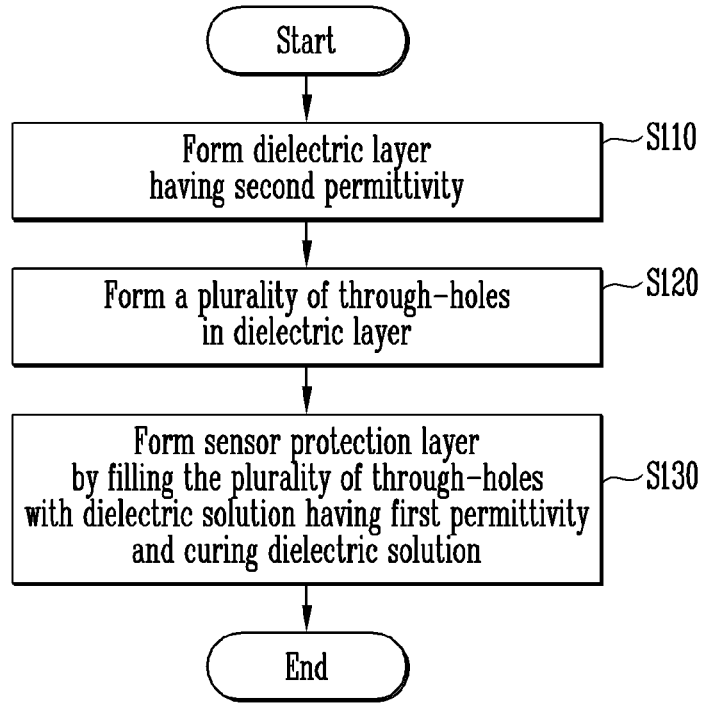
FIG. 12 is a flowchart describing in detail the step of forming a sensor protection layer shown in FIGS. 9A, 9B and 9C.

FIG. 12 is a flowchart describing in detail the step of forming a sensor protection layer shown in FIGS. 9A to 9C.

Referring to FIGS. 9A to 9C and FIG. 12, a dielectric layer DL having a second permittivity may be formed (S110).

A plurality of through-holes BK may be formed on the dielectric layer DL (S120). The plurality of through-holes BK may be formed in the dielectric layer DL such that the plurality of through holes BK are disposed on the sensor electrode 300 included in the sensor pixel SP.

For example, each of the plurality of through-holes BK may be a hollow hole formed by etching the dielectric layer DL.

According to an exemplary embodiment, each of the plurality of through-holes BK may have at least one shape of a cylinder, an ellipse cylinder, or a rectangular parallel-epiped depending on a shape of the hollow hole.

The sensor protection layer 200 may be formed by filling the plurality of through-holes BK with a dielectric solution having the first permittivity and curing the dielectric solution (S130).

For example, the dielectric solution may be cured by photo curing method or heat curing method.

As described in FIGS. 4A and 4B, the sensor protection layer 200 may include the first region R1 and the second region R2.

The first region R1 may be a region disposed on the sensor electrode 300 and the second region R2 may be a region disposed on a peripheral portion of the sensor electrode 300.

The first region R1 may have a first permittivity. The first permittivity may be a high permittivity relative to a second permittivity.

The second region R2 may have a second permittivity different from the first permittivity. The second permittivity may be a lower permittivity relative to the first permittivity.

Figure 13:
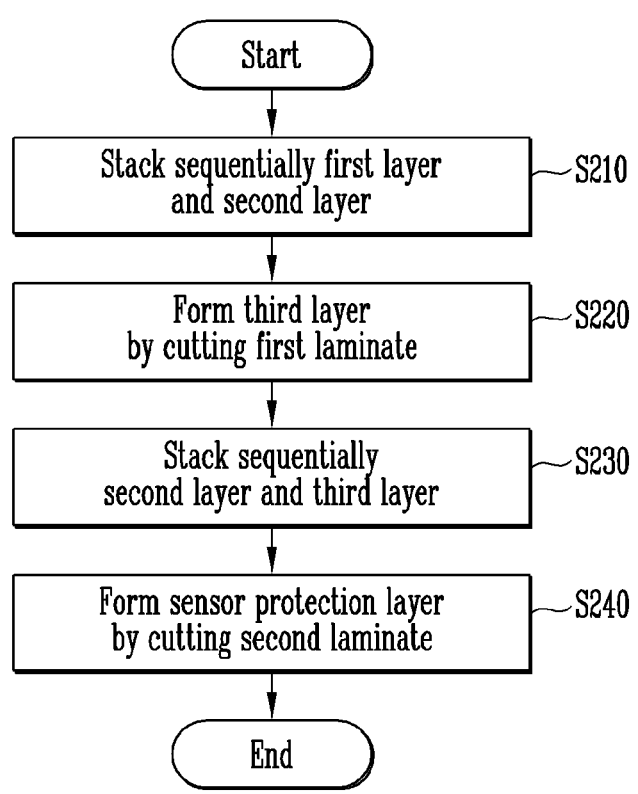
FIG. 13 is a flowchart describing in detail the step of forming a sensor protection layer shown in FIGS. 10A, 10B, 10C and 10D.

FIG. 13 is a flowchart describing in detail the step of forming a sensor protection layer shown in FIGS. 10A to 10D.

Referring to FIGS. 10A to 10D and FIG. 13, the first layer L1 having the first permittivity and the second layer L2 having the second permittivity may be sequentially stacked. As a result of stacking, a first laminate CB1 may be formed (S210).

The first laminate CB1 is cut so that a third layer L3 may be formed (S220). Specifically, the first laminate CB1 is cut along a stacking direction, so that the third layer L3 may be formed.

The second layer L2 and the third layer L3 may be sequentially stacked (S230). As a result of stacking, a second laminate CB2 may be formed.

The second laminate CB2 is cut so that a sensor protection layer 200 may be formed (S240). Specifically, the second laminate CB2 is cut along a stacking direction, so that the sensor protection layer 200 may be formed.

As described in FIGS. 4A and 4B, the sensor protection layer 200 may include a first region R1 and a second region R2.

The first region R1 may be a region disposed on the sensor electrode 300, and the second region R2 may be a region disposed on a peripheral portion of the sensor electrode 300.

The first region R1 may have a first permittivity. The first permittivity may mean a high permittivity relative to the second permittivity.

The second region R2 may have a second permittivity different from the first permittivity. The second permittivity may be a lower permittivity relative to the first permittivity Those with ordinary skill in the technical field of the present inventive concept pertains will be understood that the present inventive concept can be carried out in other specific forms without changing the technical idea or essential features. Accordingly, the preferred embodiments should be considered to be illustrative and not for purposes of limitation. The scope of the present inventive concept is defined by the appended claims rather than the foregoing description and the exemplary embodiments described therein. Various modifications made within the meaning of an equivalent of the claims of the invention and within the claims are to be regarded to be in the scope of the present inventive concept.

DESCRIPTION OF SYMBOLS

100: fingerprint sensor
110: sensor unit
120: sensor driver
200: sensor protection layer
300: sensor electrode
400: finger
SS: sensor substrate
SP: sensor pixel
AM: adhesive member

What is claimed is:

1. A fingerprint sensor comprising:
a sensor substrate;
a plurality of sensor pixels configured to sense a capacitance change corresponding to a touch of a user, wherein each of the sensor pixels includes a sensor electrode;
an adhesive member on the sensor substrate and the plurality of sensor pixels; and
a sensor protection layer disposed on the adhesive member,
wherein the sensor protection layer includes a first region having a first permittivity and a second region having a second permittivity less than the first permittivity.

2. The fingerprint sensor of claim 1, wherein
the first region is disposed on the sensor electrode, and
the second region is disposed on a peripheral portion of the sensor electrode.

3. The fingerprint sensor of claim 2, further comprising a plurality of sensors can lines and a plurality of output lines connected to the plurality of sensor pixels,
wherein a sensor pixel connected to an i-th sensor scan line (i is an integer of 2 or more) and a j-th output line (j is a natural number) among the plurality of sensor pixels includes:
a first transistor of which a gate electrode is connected to the sensor electrode, the first transistor configured to control a current output through the j-th output line;
a second transistor of which a gate electrode is connected to the i-th sensor scan line, the second transistor coupled between a reference voltage line and the first transistor; and
a capacitor electrode which forms a first capacitor together with the sensor electrode, the capacitor electrode connected to the i-th sensor scan line.

4. The fingerprint sensor of claim 3, wherein
the sensor pixel further includes a third transistor of which a gate electrode is connected to the i−1 thscan line, the third transistor coupled between the reference voltage line and the sensor electrode.

5. The fingerprint sensor of claim 4, wherein
the sensor electrode is configured to form a second capacitor together with a finger of the user when a touch occurs.

6. The fingerprint sensor of claim 5, wherein
the fingerprint sensor is configured to recognize a fingerprint or a palm print of the user by using a capacitance change of the second capacitor corresponding to the touch.

7. The fingerprint sensor of claim 3, further comprising:
a sensors can driver configured to sequentially supply a sensor scan signal to the plurality of sensor scan lines; and
a read out circuit configured to detect a fingerprint or a palm print by using a current output through the plurality of output lines.

8. The fingerprint sensor of claim 2, wherein
a portion of the second region overlaps the sensor electrode.

9. The fingerprint sensor of claim 2, wherein
the first permittivity is a relative dielectric constant in a range of 7 or more, and
the second permittivity is a relative dielectric constant in a range of 1 to less than 7.

10. The fingerprint sensor of claim 2, wherein
the first region includes an inorganic filler by a first ratio, and
the second region includes the inorganic filler by a second ratio lower than the first ratio.

11. A manufacturing method of a fingerprint sensor comprising:
forming a plurality of sensor pixels on a sensor substrate, wherein each of the sensor pixels includes a sensor electrode;
forming an adhesive member on the sensor substrate and the plurality of sensor pixels;
forming a sensor protection layer; and
attaching the sensor protection layer on the adhesive member,
wherein the sensor protection layer includes a first region having a first permittivity and a second region having a second permittivity less than the first permittivity.

12. The manufacturing method of a fingerprint sensor of claim 11, wherein
the first region is disposed on the sensor electrode, and
the second region is disposed on a peripheral portion of the sensor electrode.

13. The manufacturing method of a fingerprint sensor of claim 11, wherein:
the first region includes an inorganic filler by a first ratio, and
the second region includes the inorganic filler by a second ratio lower than the first ratio.

14. The manufacturing method of a fingerprint sensor of claim 13, wherein:
the inorganic filler includes at least one selected from barium titanate ($BaTiO_3$), alumina ($Al_2O_3$), and titanium oxide (TiO).

15. The manufacturing method of a fingerprint sensor of claim 11, wherein
forming a sensor protection layer includes:
forming a dielectric layer having the second permittivity;
forming a plurality of through-holes in the dielectric layer; and
filling the plurality of through-holes with a dielectric solution having the first permittivity, and curing the dielectric solution.

16. The manufacturing method of a fingerprint sensor of claim 15, wherein
a through-hole array includes a plurality of through-holes, and
each of the plurality of through-holes is disposed on the sensor electrode.

17. The manufacturing method of a fingerprint sensor of claim 16, wherein
each of the plurality of through-holes have at least one shape selected from a cylinder,
an elliptic cylinder, and a rectangular parallelepiped.

18. The manufacturing method of a fingerprint sensor of claim 11, wherein forming the sensor protection layer include:
  forming a first laminate by sequentially stacking a first layer having the first permittivity and a second layer having the second permittivity;
  forming a third layer by cutting the first laminate;
  forming a second laminate by sequentially stacking the second layer and the third layer; and
  cutting the second laminate.

19. The manufacturing method of a fingerprint sensor of claim 18, wherein
  the first layer has a thickness in a range of 130 µm to 150 µm, and
  the second layer has a thickness in a range of 20 µm to 30 µm.

* * * * *